(12) United States Patent
Ahn et al.

(10) Patent No.: US 11,145,788 B2
(45) Date of Patent: Oct. 12, 2021

(54) MICRO LED TRANSFER HEAD

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/734,175

(22) Filed: Jan. 3, 2020

(65) Prior Publication Data

US 2020/0220042 A1    Jul. 9, 2020

(30) Foreign Application Priority Data

Jan. 7, 2019   (KR) .......................... 10-2019-0001684

(51) Int. Cl.
*H01L 33/00* (2010.01)
*H01L 33/64* (2010.01)
*H01L 25/075* (2006.01)

(52) U.S. Cl.
CPC ...... *H01L 33/0095* (2013.01); *H01L 25/0753* (2013.01); *H01L 33/648* (2013.01)

(58) Field of Classification Search
CPC ........... H01L 21/67144; H01L 33/0095; H01L 25/0753; H01L 33/648; H01L 21/6838; H01L 21/67775; H01L 21/67778; H01L 21/683; B65G 47/92; B65G 47/91; B25J 15/0691; B25J 15/0616; B25J 15/0683; B25J 7/00
USPC .......................................................... 257/79
See application file for complete search history.

(56) References Cited

U.S. PATENT DOCUMENTS

| | | | |
|---|---|---|---|
| 10,002,856 B1* | 6/2018 | Bedell | H01L 21/6836 |
| 2017/0167025 A1* | 6/2017 | Ahn | B01D 67/0065 |
| 2017/0338199 A1* | 11/2017 | Zou | H01L 33/0093 |
| 2018/0096878 A1* | 4/2018 | Wu | H01L 21/6838 |
| 2018/0204973 A1* | 7/2018 | Jeung | H01L 33/32 |
| 2018/0342407 A1* | 11/2018 | Chen | H01L 25/167 |
| 2019/0252350 A1* | 8/2019 | Schwarz | H01L 24/75 |

FOREIGN PATENT DOCUMENTS

| | | |
|---|---|---|
| KR | 100731673 B1 | 6/2007 |
| KR | 20140112486 A | 9/2014 |
| KR | 20170019415 A | 2/2017 |
| KR | 20170024906 A | 3/2017 |
| KR | 20170026959 A | 3/2017 |
| KR | 101754528 B1 | 7/2017 |
| KR | 101757404 B1 | 7/2017 |

* cited by examiner

*Primary Examiner* — Jonathan Han

(57) ABSTRACT

The present invention relates generally to a micro LED transfer head transferring a micro light-emitting diode (micro LED) from a first substrate to a second substrate. More particularly, the present invention relates to a micro LED transfer head holding and transferring a micro LED in which holding portions and surrounding areas of the holding portions are configured of different materials.

10 Claims, 6 Drawing Sheets

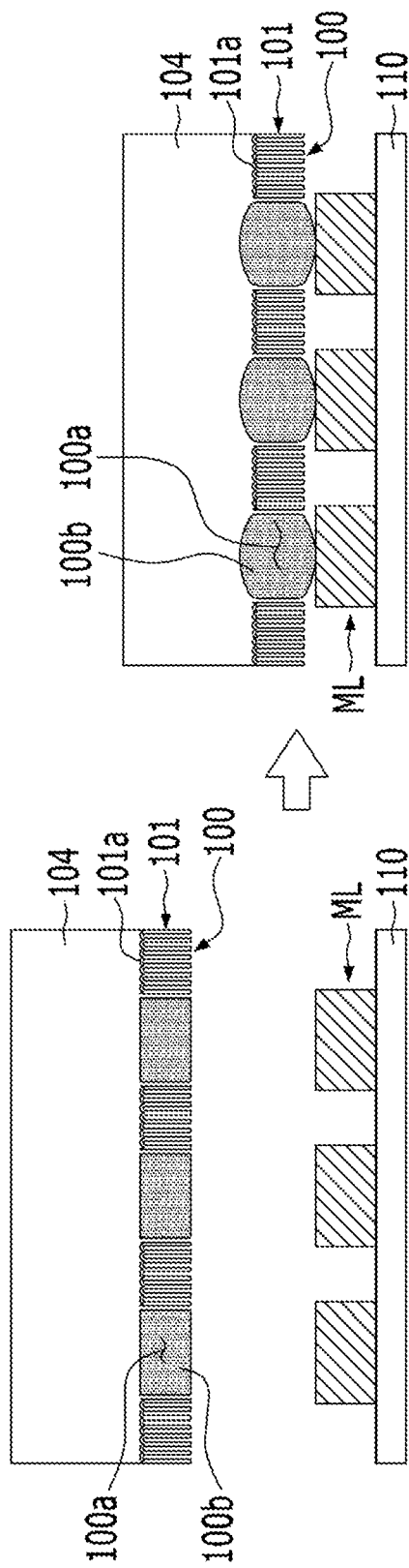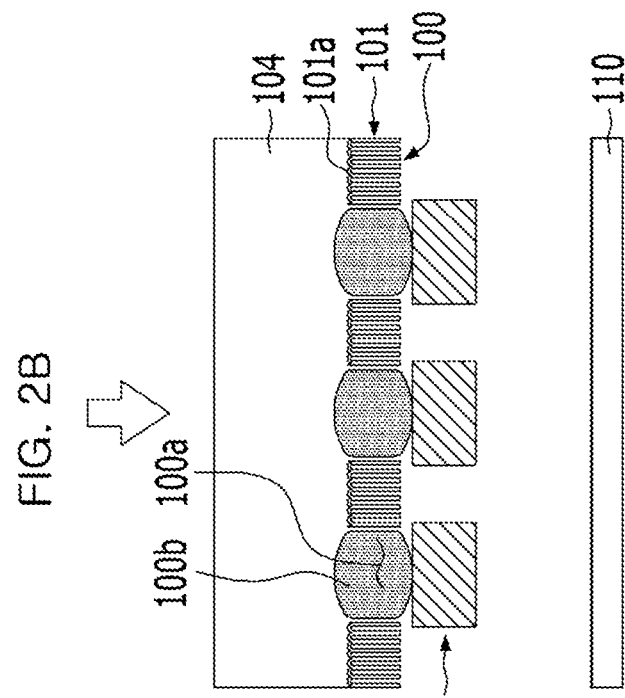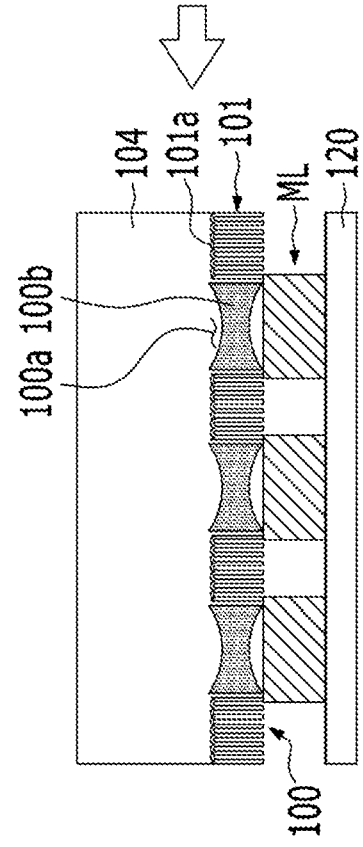

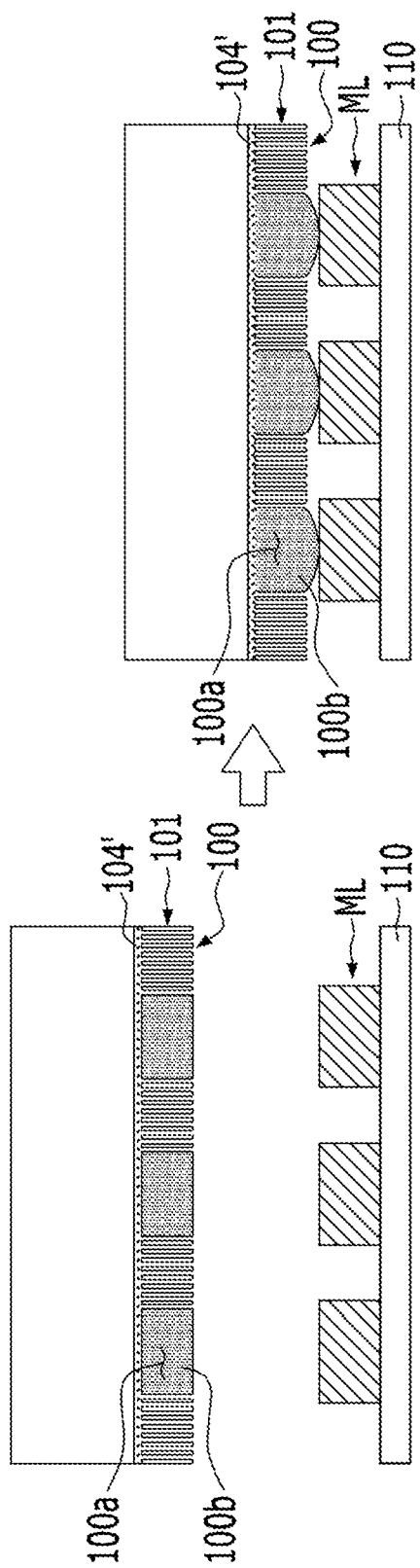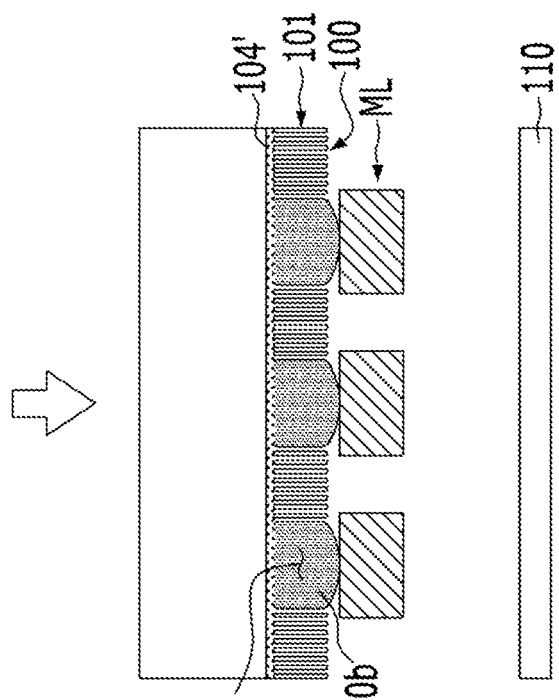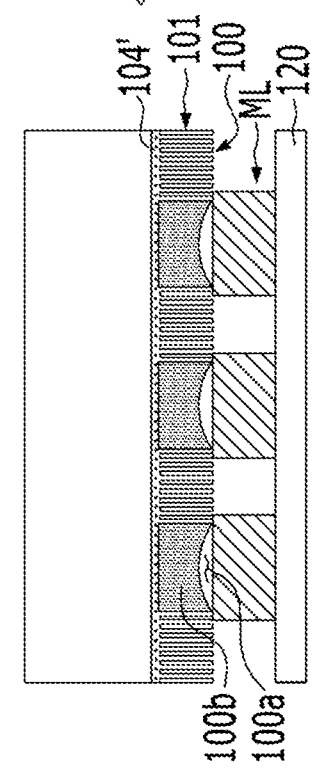

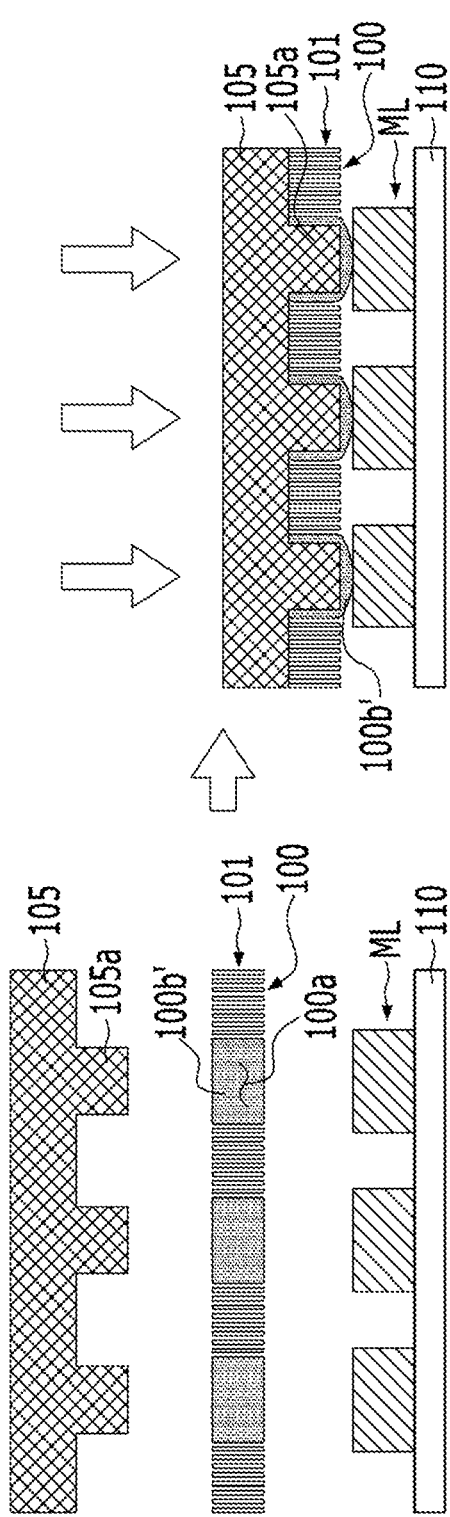
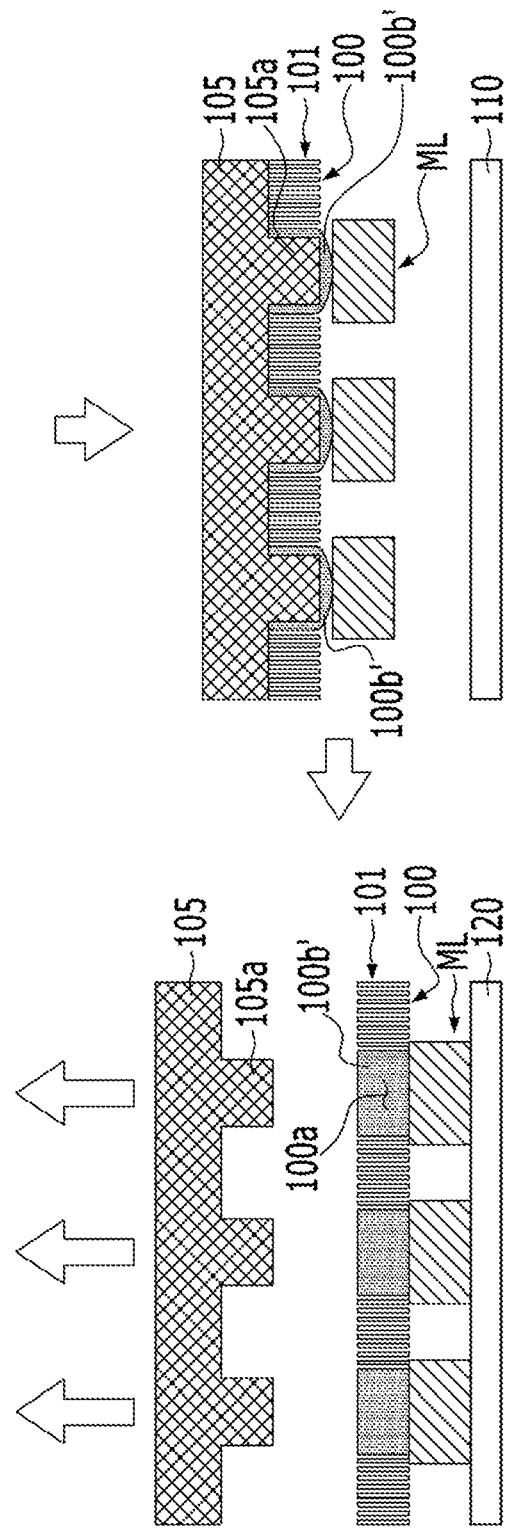
FIG. 5A
FIG. 5B
FIG. 5C
FIG. 5D

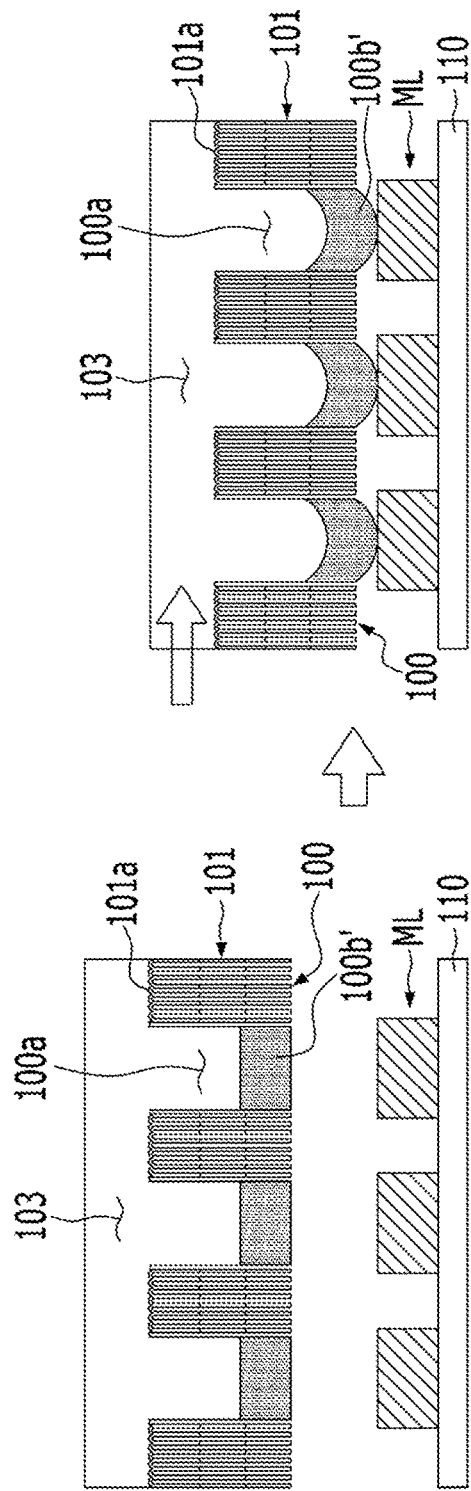
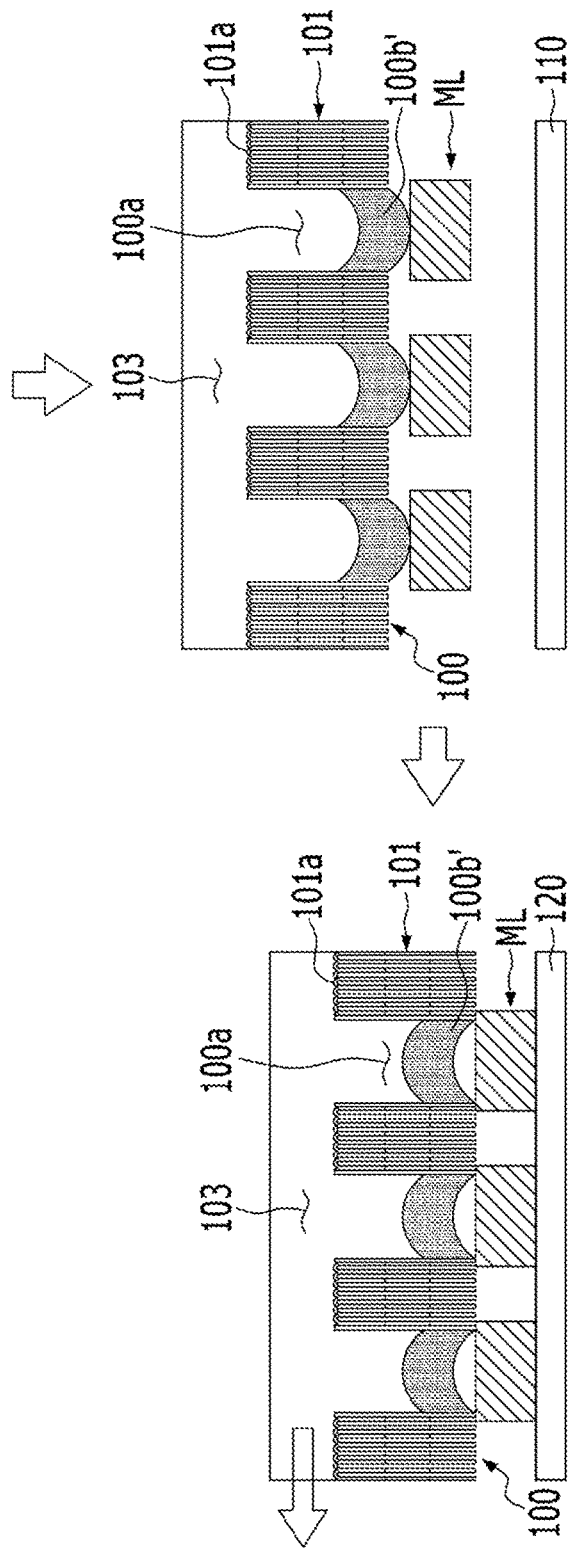
FIG. 6A
FIG. 6B
FIG. 6C
FIG. 6D

MICRO LED TRANSFER HEAD

CROSS REFERENCE TO RELATED APPLICATION

The present application claims priority to Korean Patent Application No. 10-2019-0001684, filed Jan. 7, 2019, the entire contents of which is incorporated herein for all purposes by this reference.

BACKGROUND OF THE INVENTION

Field of the Invention

The present invention relates to a micro LED transfer head transferring a micro light-emitting diode (micro LED) from a first substrate to a second substrate.

Description of the Related Art

Currently, the display market remains dominated by LCDs, but OLEDs are quickly replacing LCDs and emerging as mainstream products. In the current situation in which display makers are rushing to participate in the OLED market, micro light-emitting diode (hereinafter, referred to as micro LED) displays have emerged as another type of next generation display. Micro LED is not a package type covered with molding resin or the like but a piece obtained by cutting out a wafer used for crystal growth. Liquid crystal and organic materials are the core materials of LCDs and OLEDs, respectively, whereas the micro LED display uses 1 μm to 100 μm of LED chips as a light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or a flexible device using a micro LED device, and techniques of transferring micrometer-sized LED chips and accurately mounting the LED chips on a display pixel electrode are required.

Particularly, with regard to the transfer of the micro LED device to a display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below.

Luxvue Technology Corp., USA, proposed a method of transferring a micro LED using an electrostatic head (Korean Patent Application Publication No. 10-2014-0112486, hereinafter referred to as 'Related Art 2'). A transfer principle of Related Art Document 1 is that a voltage is applied to a head unit made of a silicone material so that the head unit comes into close contact with a micro LED due to electrification. However, this method may cause damage to micro LEDs due to electrification caused by the voltage applied to the head unit during induction of static electricity.

X-Celeprint Limited, USA, proposed a method of using an elastic polymer material as a transfer head and transferring micro LEDs positioned on a wafer to a desired substrate (Korean Patent Application Publication No. 10-2017-0019415, hereinafter referred to as 'Related Art 3'). According to Related Art Document 2, there is no damage to micro LEDs as compared with the above-mentioned electrostatic head. However, adhesive force of the elastic transfer head is required to be higher than that of a target substrate in the transfer process to transfer micro LEDs stably, and an additional process for forming an electrode is required. In addition, maintaining adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in Related Art Document 3, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, Related Art Document 4 has a problem in that continuous use of the adhesive is required, and the micro LED may be damaged when pressed with the roller.

Samsung Display Co., Ltd proposed a method of transferring micro LEDs to an array substrate according to electrostatic induction by applying a negative voltage to first and second electrodes of the array substrate in a state in which the array substrate is immersed in a solution (Korean Patent Application Publication No. 10-2017-0026959, hereinafter referred to as 'Related Art 6'). However, Related Art Document 5 has a problem in that a solution is required since the micro LED is immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, Related Art Document has a problem in that a process of applying a bonding material to the pick-up heads is required because the bonding material having adhesive force is required to be applied to bonding surfaces of the multiple pick-up heads to transfer the micro LED.

In order to solve the above problems of Related Art Documents, it may be considered that microholes in which a holding force for micro LEDs is generated are provided in a transfer head for transferring the micro LEDs. The holes may be formed in a head unit constituting the transfer head. The transfer head can hold the micro LEDs by the holding force generated in the holes of the head unit. In this case, the head unit of the transfer head may be made of a material having a high degree of hardness to prevent product deformation. However, when the holding force is generated in the holes of the head unit to hold the micro LEDs, the micro LEDs may be damaged due to the high hardness of the head unit.

In order to prevent such a micro LED damage problem when the head unit having a high degree of hardness and the micro LEDs come into contact with each other, a head unit made of an elastic material may be provided. The head unit of the elastic material can perform a buffer function when coming into contact with the micro LEDs, thereby preventing the micro LED damage problem. However, the head unit of the elastic material has a high coefficient of thermal expansion. When the head unit of the elastic material is affected by the temperature during a process, positional misalignment due to thermal expansion may occur. In the case of the transfer head, since thousands to tens of thousands of micro LEDs are held simultaneously, it is important to align positions of the holes of the head unit for holding the micro LEDs. However, in the case of the transfer head including the head unit of the elastic material, the transfer head may be thermally affected during a process due to the high coefficient of thermal expansion, alignment relative to each micro LED may be misaligned. This may result in a micro LED transfer error problem in the transfer head.

As described above, when focusing on the aspect of preventing product deformation, the micro LED damage problem may be caused by the head unit having a high degree of hardness. On the other hand, when focusing on the aspect of preventing micro LED damage, the problem that alignment relative to the micro LEDs is misaligned may be caused by the head unit made of a material having a high coefficient of thermal expansion while providing the buffer function. Accordingly, the applicant of the present invention has proposed a method that can improve the problems of the related art described above and to compensate for the disadvantages of the technology underlying the present invention.

The foregoing is merely intended to aid in the understanding of the background of the present invention, and is not intended to imply that the present invention falls within the purview of the related art that is already known to those skilled in the art.

DOCUMENTS OF RELATED ART (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906

SUMMARY OF THE INVENTION

Accordingly, the present invention has been made keeping in mind the above problems occurring in the related art, and an objective of the present invention is to provide a micro LED transfer head in which micro LED holding portions and surrounding areas of the holding portions are configured of different materials, thereby improving accuracy of holding micro LEDs at the holding portions.

In order to achieve the above objective, according to one aspect of the present invention, there is provided a micro LED transfer head, including: a head unit including a plurality of through-holes formed by passing therethrough from top to bottom, wherein a thermo-deformable material is provided in each of the through-holes such that micro LEDs are held onto surfaces of the thermo-deformable materials.

Furthermore, a support part of the head unit may be configured of at least one anodic oxide sheet.

Furthermore, the thermo-deformable materials may be supported by a support part of the head unit, the support part surrounding the thermo-deformable materials.

Furthermore, a temperature control means may be provided at an upper portion of the head unit.

Furthermore, the temperature control means may be a fluid, and when the thermo-deformable materials are expanded by temperature control of the fluid, the micro LEDs may be held onto the surfaces of the expanded thermo-deformable materials, and when the thermo-deformable materials are contracted by temperature control of the fluid, the micro LEDs may be detached from the surfaces of the contracted thermo-deformable materials.

Furthermore, the temperature control means may be a thermo-conductive film, and when the thermo-deformable materials are expanded by the thermo-conductive film, the thermo-deformable materials may hold the micro LEDs, and when the thermo-deformable materials are contracted by the thermo-conductive film, the thermo-deformable materials may detach the micro LEDs.

Furthermore, the thermo-deformable material may be polydimethylsiloxane (PDMS).

According to another aspect of the present invention, there is provided a micro LED transfer head, including: a head unit including a plurality of through-holes passing therethrough from top to bottom, which a pressure-deformable material provided in each of the through-holes; and a pressurizing member provided at an upper portion of the head unit and including a protrusion, wherein the protrusion is provided at a position corresponding to each of the through-holes such that the pressure-deformable materials are deformed by the pressurizing member.

According to still another aspect of the present invention, there is provided a micro LED transfer head, including: a head unit including a plurality of through-holes passing therethrough from top to bottom, with a pressure-deformable material provided in each of the through-holes; and a chamber provided at an upper portion of the head unit and in which pressure is controlled, wherein when the pressure in the chamber is controlled to a high-pressure state, the pressure-deformable materials are expanded and the micro LEDs are held onto surfaces of the expanded pressure-deformable materials, and when the pressure in the chamber is controlled to a low-pressure state, the pressure-deformable materials are contracted and the micro LEDs are detached from the surfaces of the contracted pressure-deformable materials.

The micro LED transfer head according to the present invention is characterized in that the holding portions and the surrounding areas of the holding portions are configured of different materials, thereby preventing hold position alignment relative to the micro LED from being misaligned at the holding portions and thus achieving improved micro LED holding accuracy.

BRIEF DESCRIPTION OF THE DRAWINGS

The above and other objectives, features and other advantages of the present invention will be more clearly understood from the following detailed description when taken in conjunction with the accompanying drawings, in which:

FIGS. 2A to 2D are views schematically illustrating an operation sequence of the micro LED transfer head according to the first embodiment of the present invention;

FIGS. 4A to 4D are views schematically illustrating an operation sequence of a micro LED transfer head according to a second embodiment of the present invention;

FIGS. 5A to 5D are views schematically illustrating an operation sequence of a micro LED transfer head according to a third embodiment of the present invention; and FIGS. 6A to 6D are views schematically illustrating an operation sequence of a micro LED transfer head according to a fourth embodiment of the present invention.

DETAILED DESCRIPTION OF THE INVENTION

Figure 1:
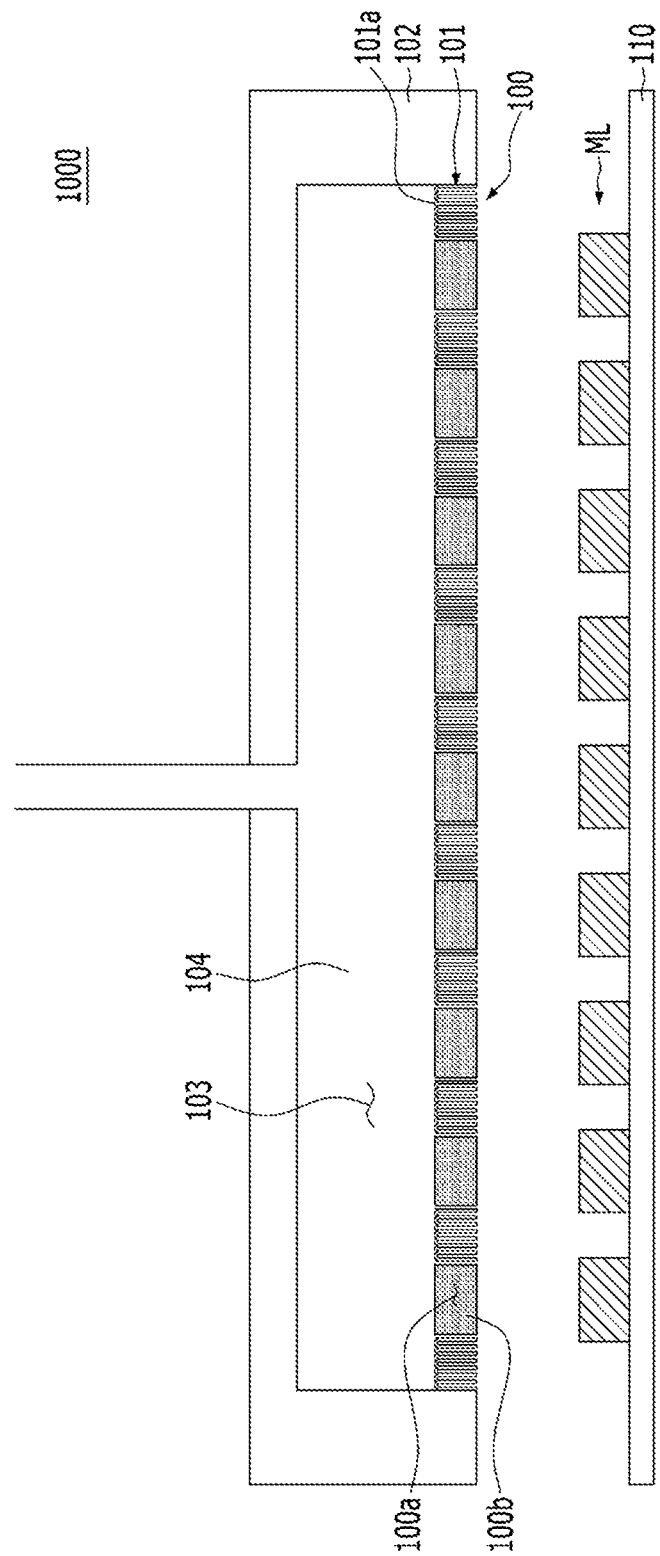
FIG. 1 is a view schematically illustrating a micro LED transfer head according to a first embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited the specifically-listed embodiments and the conditions.

The above described objectives, features, and advantages will be more apparent through the following detailed description related to the accompanying drawings, and thus those of ordinary skill in the art may easily implement the technical spirit of the invention.

The embodiments of the present invention will be described with reference to cross-sectional views and/or perspective views which schematically illustrate ideal embodiments of the present invention. For explicit and convenient description of the technical content, sizes or thicknesses of members and areas in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of areas illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

A micro LED transfer head 1000 according to the present invention includes a head unit 100 for holding micro LEDs ML. The head unit 100 may include a holding part for holding the micro LEDs ML and provided with a thermo-deformable material or a pressure-deformable material, and a support part for supporting the holding part. The head unit 100 may be configured such that the holding part and the support part are configured of materials having properties the opposite of each other.

In detail, the holding part may be configured of the thermo-deformable material. In this case, the support part may be configured of a material having a low coefficient of thermal expansion, a property opposite to a high coefficient of thermal expansion of the thermo-deformable materials. Due thereto, when the head unit 100 is temperature-controlled to a high temperature, the holding part may easily be thermally deformed to meet the property of the high coefficient of thermal expansion, the support part may not be thermally deformed to meet the property of the low coefficient of thermal expansion. If the materials having the opposite properties in the same temperature condition as described above to function according to individual properties, the holding part can faithfully perform the function of holding the micro LEDs ML due to thermal expansion of the thermo-deformable material, and the support part can faithfully perform the function of supporting the holding part thermally deformed, by not being thermally deformed by the influence of heat.

The holding part may be configured of the pressure-deformable material. In this case, the support part may be configured of a material having a high rigidity, a property opposite to a high modulus of elasticity of the pressure-deformable materials. Due thereto, when pressure is applied to the head unit 100, the support part supporting the holding part is not deformed but can stably support the deformed holding part.

As described above, the head unit 100 is configured of materials having properties the opposite of each other, so that each material can perform the function thereof according to the property, thereby improving micro LED ML holding efficiency.

Hereinafter, exemplary embodiments of the present invention will be described in detail with reference to the accompanying drawings.

FIG. 1 is a view schematically illustrating a micro LED transfer head 1000 according to a first embodiment of the present invention. As illustrated in FIG. 1, the micro LED transfer head 1000 according to the first embodiment of the present invention includes a head unit 100, a support member 102 for supporting the head unit 100, and a temperature control means 104.

The micro LED transfer head 1000 according to the first embodiment may hold micro LEDs ML using adhesive force or Van der Waals force. The micro LED transfer head 1000 may hold the micro LEDs ML of a first substrate 110 (for example, a growth substrate, a temporary substrate, or a carrier substrate) with the adhesive force or Van der Waals force and transfer the micro LEDs ML to a second substrate 120 (for example, a display substrate or a target substrate). FIG. 1 illustrates a state before the micro LED transfer head 1000 holds the micro LEDs. Therefore, the substrate disposed below the micro LED transfer head 1000 may be the first substrate 110.

The micro LED transfer head 1000 may hold the micro LEDs ML by the head unit 100 in which a plurality of through-holes 100a are formed.

The head unit 100 may include a holding part for holding the micro LEDs ML and provided with a thermo-deformable material 100b and, and a support part for supporting the holding part.

The support part of the head unit 100 may be configured of a material having a low coefficient of thermal expansion. Due thereto, the head unit 100 may have high thermal durability in a high temperature state, and thus may have low thermal deformation by temperature. The head unit 100 is configured to hold the micro LEDs ML in direct contact with the micro LEDs ML. Therefore, positional alignment relative to the micro LEDs ML is important. For example, when the support part of the head unit is configured of a material having a high coefficient of thermal expansion, the support part may be easily deformed by temperature under a high temperature environment. Deformation of the support part of the head unit by temperature may cause positional misalignment relative to the micro LEDs ML. This may cause the problem of micro LED hold and transfer error, resulting in lowered transfer efficiency of the micro LED transfer head. However, in the prevention invention, the support part of the head unit 100 is configured of a material having a low coefficient of thermal expansion. This makes it possible to prevent that the head unit may be thermally deformed by temperature and alignment relative to each of the micro LEDs ML may be misaligned.

The head unit 100 may be structured such that the plurality of through-holes 100a pass through the head unit 100 from top to bottom. The through-holes 100a may be formed in the support part. Due to the formation of the through-holes 100a formed in the support part, the holding part may be defined at the head unit 100.

Each of the plurality of through-holes 100a may be formed in a position corresponding to each of the micro LEDs ML of the first substrate 110. Due thereto, each of the micro LEDs ML may be held on the surface of each of the thermo-deformable materials 100b provided in the respective through-holes 100a.

The through-holes 100a may be smaller or larger in width than the micro LEDs ML of the first substrate 110. When the through-holes 100a have a smaller width than the micro LEDs ML, when the micro LEDs ML are detached from the surfaces of the thermo-deformable materials 100b provided in the through-holes 100a which will be described later, detachment of the micro LEDs ML can be easily undertaken. In detail, the thermo-deformable materials 100b provided in the through-holes 100a which will be described later may be expanded and contracted by temperature control of the temperature control means 140 provided at the micro LED transfer head 1000. When the thermo-deformable materials 100b are expanded, the micro LEDs ML may be held on the surfaces of the thermally deformable materials 100b. On the other hand, when the thermo-deformable materials 100b contract, the micro LEDs ML may be detached from the surfaces of the thermo-deformable materials 100b. In this case, when the through-holes 100a have a smaller width than the micro LEDs ML, the micro LEDs ML may be detached only by contraction of the thermo-deformable materials 100b. Since the through-holes 100a have a smaller width than the micro LEDs ML, when the thermo-deformable materials 100b provided in the through-holes 100a contract, upper surfaces of the micro LEDs ML are released from contact with the surfaces of the thermo-deformable materials 100b. In other words, when the thermo-deformable materials 100b contract, contact surfaces do not exist between micro LED hold surfaces, which are the upper surfaces of the micro LEDs ML, and the surfaces of the thermo-deformable material 100b. Due thereto, a holding force acting on the micro LEDs ML does not exist, whereby the micro LEDs ML are detached from the surfaces of the thermo-deformable materials 100b. As described above, when the through-holes 100a are formed smaller in width than the micro LEDs ML, the micro LEDs ML can be easily detached from the surfaces of the thermo-deformable materials 100b, even if a separate holding force generating means for detaching the micro LEDs ML from the surfaces of the thermo-deformable materials 100b is not provided at lower portions of the micro LEDs ML.

Meanwhile, the through-holes 100a may be equal to or greater in width than the micro LEDs ML. In this case, the micro LEDs ML may be held in a larger area of the thermo-deformable materials 100b. However, it is necessary that a separate holding force generating means for detaching the micro LEDs ML from the surfaces of the thermo-deformable materials 100b is provided at the lower portions of the micro LEDs ML.

The thermo-deformable materials 100b provided in the through-holes 100a are materials having a high coefficient of thermal expansion. Due thereto, the thermo-deformable materials 100b may be easily expanded and contracted in the through-holes 100a. As one example of the present invention, the thermo-deformable materials 100b may be polydimethylsiloxane (PDMS).

Since the thermo-deformable materials 100b have a high coefficient of thermal expansion, the thermo-deformable materials 100b may be easily deformed by heat. The thermo-deformable materials 100b are provided in the through-holes 100a formed by passing from top to bottom through the head unit 100 having a low coefficient of thermal expansion. Therefore, inner walls of the through-holes 100a have the low coefficient of thermal expansion. In other words, the thermo-deformable materials 100b and the inner walls of the through-holes 100a in which the thermo-deformable materials 100b are provided have different coefficients of thermal expansion. Due thereto, under the same high temperature environment, the thermo-deformable materials 100b are easily thermally deformed, while the inner walls of the through-holes 100a are not thermally deformed.

The thermo-deformable materials 100b may have a shape provided in the through-holes 100a to be supported by the support part of the head unit 100 surrounding the thermo-deformable materials 100b. In other words, the holding part may have a shape supported by the support part. The thermo-deformable materials 100b may be supported by the inner walls of the through-holes 100a. Due thereto, when the thermo-deformable materials 100b are thermally deformed under a high temperature environment, supported portions of the thermo-deformable materials 100b supported by the inner walls of the through-holes 100a are suppressed from thermal deformation, while unsupported portions of the thermo-deformable materials 100b (for example, upper and lower portions of the through-holes 100a) that are not supported by the inner walls of the through-holes 100a may be thermally deformed. Since the supported portions of the thermo-deformable materials 100b are supported by the inner walls of the through-holes 100a having a low thermal expansion coefficient, expansion of the thermo-deformable materials 100b by temperature can be suppressed. On the other hand, the unsupported portions of the thermo-deformable materials 100b may be expanded and contracted by temperature to thermally deform. Due thereto, the micro LEDs ML may be held on the surfaces of the thermo-deformable materials 100b when the head unit 100 comes into contact with the micro LEDs ML. A detailed description thereof will be described later with reference to FIGS. 2A to 2D.

As described above, the present invention is configured such that the support part of the head unit 100, and the thermo-deformable materials 100b that are provided in the through-holes 100a defining the holding part of the head unit 100 are configured of different kinds of materials having different coefficients of thermal expansion. In other words, the holding part and the support part of the head unit 100 are configured of materials having properties the opposite of each other. Therefore, the support part of the head unit and the thermo-deformable materials 100b of the holding part may differ from each other in thermal deformation under the same temperature condition. The present invention can, through provision of the temperature control means 104 at an upper portion of the head unit 100 of the micro LED transfer head 1000, can hold or detach the micro LEDs ML by differing degrees of thermal deformation of the support part of the head unit 100 and the thermo-deformable materials 100b of the holding part under the same temperature condition.

In the present invention, as one example, the head unit 100 may include at least one anodic oxide sheet 101. As illustrated in FIG. 1, in detail, the support part of the head unit 100 includes at least one anodic oxide sheet 101. The plurality of through-holes 100a are formed in the anodic oxide sheet 101 by passing through the anodic oxide sheet 101 from top to bottom, and the thermo-deformable materials 100*b* are provided in the through-holes 100*a*.

The anodic oxide sheet 101 may be an anodic oxide film having pores formed by anodizing a metal.

The anodic oxide film is a film formed by anodizing a metal that is a base material, and the pores are pores formed in a process of forming the anodic oxide sheet by anodizing the metal. For example, in a case that the base metal is aluminum (Al) or an aluminum alloy, the anodization of the base material forms an anodic oxide film consisting of anodized aluminum ($Al_2O_3$) on a surface of the base material. The anodic oxide film formed as above is divided into a barrier layer 101*a* having pores formed therein and a porous layer having no pores formed therein. The barrier layer 101*a* is located on an upper portion of the base material and the porous layer is located on an upper portion of the barrier layer 101*a*. After removing the base material on which the anodic oxide film having the barrier layer 101*a* and the porous layer is formed, only the anodic oxide film consisting of anodized aluminum ($Al_2O_3$) remains.

The anodic oxide film has pores configured vertically and having a regular arrangement with a uniform diameter. Accordingly, after removing the barrier layer 101*a*, the pores have a structure extending from top to bottom vertically. FIG. 1 illustrates that the barrier layer 101*a* is located on an upper portion of the anodic oxide film and the porous layer having the pores is located on a lower portion thereof. However, the anodic oxide sheet 101 illustrated in FIG. 1 may be reversed up and down such that the barrier layer 101*a* is located on the lower portion of the anodic oxide film. As described above, the barrier layer 101*a* may be configured to close one of upper and lower portions of the anodic oxide sheet 101. The barrier layer 101*a* may prevent that when the temperature control means 104 which will described later is a fluid, the fluid leaks through the pores of the head unit 100 to adversely affect the exterior thereof.

The temperature control means 104 may be provided at the upper portion of the head unit 100. The temperature control means 104 may be a fluid. The temperature control means 104 may be provided in a chamber 103 provided at the upper portion the head unit 100.

The temperature of the head unit 100 may be controlled by the temperature control means 104.

When the fluid which is the temperature control means 104 is heated, the head unit 100 may be thermally affected. In this case, the anodic oxide sheet 101 constituting the head unit 100 has a low coefficient of thermal expansion of 2 to 3 ppm/° C. Therefore, the anodic oxide sheet 101 may not be easily thermally deformed by temperature control of the fluid. The anodic oxide sheet 101 is not thermally deformed under a high temperature environment due to high thermal durability thereof, and thus positional misalignment relative to the micro LEDs ML to be held does not occur.

Since the thermo-deformable materials 100*b* provided in the through-holes 100*a* formed in the anodic oxide sheet 101 have a high coefficient of thermal expansion, the thermo-deformable materials 100*b* may be easily thermally deformed by temperature control of the fluid. In detail, when the fluid is heated, the thermo-deformable materials 100*b* may be expanded by temperature control of the fluid. The thermo-deformable materials 100*b* are supported by the inner walls of the through-holes 100*a*. Therefore, the supported portions of the thermo-deformable materials 100*b* supported by the through-holes 100*a* are suppressed in expansion, while the unsupported portions thereof may be expanded. The through-holes 100*a* may be micro LED ML holding portions because when the thermo-deformable materials 100*b* provided in the through-holes 100*a* are convexly expanded downward, the micro LEDs ML are held on protruding surfaces of the expanded thermo-deformable materials 100*b*.

As described above, in the present invention, a holding material of the holding portions for holding the micro LEDs ML and a material of surrounding areas of the holding portions are provided differently. In other words, the holding part and the support part of the head unit 100 are configured of materials having properties the opposite of each other. In detail, the thermo-deformable materials 100*b* having a high coefficient of thermal expansion are used as the holding material of the holding portions for holding the micro LEDs ML, and the anodic oxide sheet 101 having a low coefficient of thermal expansion is used as the material of the surrounding areas of the holding portions. In other words, the thermo-deformable materials 100*b* are provided at the holding part, and the anodic oxide sheet 101 is provided at the support part. Therefore, the holding portions and the surrounding areas of the holding portions have different coefficients of thermal expansion. Due thereto, the surrounding areas of the holding portions are not thermally deformed and thus alignment of the holding portions is not changed, thereby preventing the problem that alignment relative to the micro LEDs ML may be misaligned. Furthermore, the holding material of the holding portions is easily thermally deformed and has a low hardness. Therefore, the problem of damage to the micro LEDs ML which may occur when the head unit 100 comes into contact with the micro LEDs ML can be prevented.

On the other hand, when the fluid which is the temperature control means 104 is cooled, the expanded thermo-deformable materials 100*b* may be contracted by temperature control. The heated fluid may be cooled to detach the micro LEDs ML held on the surfaces of the protruding expanded thermo-deformable materials 100*b*. The thermo-deformable materials 100*b* are concavely contracted inward by temperature control of the cooled fluid, and the micro LEDs ML, which have been held on the surfaces of the expanded thermo-deformable materials 100*b*, are detached from the surfaces of the thermo-deformable materials 100*b*.

As in the first embodiment of the present invention, when the head unit 100 is configured of the anodic oxide sheet 101, the pores provided in the anodic oxide sheet 101 may perform the function of thermal insulation around the through-holes 100*a*. Due thereto, the thermal effect of the temperature control means 104 on the thermo-deformable materials 100*b* may be maximized. The pores provided in the anodic oxide sheet 101 may be formed in a form of air pillars around the through-holes 100*a*. The thermo-deformable materials 100*b* may be provided in the through-holes 100*a*. Therefore, there may be formed a structure in which the pores of the anodic oxide sheet 101 surround the peripheries of the thermo-deformable materials 100*b*. Due thereto, the temperature of through-hole forming areas in which the through-holes 100*a* are formed may be further increased. As a result, there is an effect that the thermo-deformable materials 100*b* provided in the through-holes 100*a* can be sufficiently deformed even with a small amount of energy.

In addition, the anodic oxide sheet 101 has a coefficient of thermal expansion similar to that of the first substrate 110 on which the micro LEDs ML are provided. Therefore, the anodic oxide sheet 101 and the first substrate 110 may be similarly thermally expanded when a temperature change occurs during a process. This makes it possible to prevent the problem of micro LED holding error which may be caused by thermal deformation of the head unit 100 and the first substrate 110 at different thermal expansion rates.

FIGS. 2A to 2D are views schematically illustrating an operation sequence of the micro LED transfer head 1000 according to the first embodiment of the present invention. In FIGS. 2A to 2D, for convenience of description, a portion of the head unit 100 of the micro LED transfer head 1000 and a portion of the micro LEDs ML of the first substrate 110 are illustrated enlarged.

The micro LED transfer head 1000 according to the first embodiment may hold or detach the micro LEDs ML by thermally deforming the thermo-deformable materials 100*b* of the head unit 100 through the temperature control means 104.

FIG. 2A is a view illustrating a state in which the head unit 100 of the micro LED transfer head 1000 of the first embodiment is not temperature-controlled by the temperature control means 104. As illustrated in FIG. 2A, the micro LED transfer head 1000 is located above the micro LEDs ML of the first substrate 110. A fluid which is the temperature control means 104 may be provided at the upper portion of the head unit 100.

The micro LED transfer head 1000 may control the temperature of the head unit 100 to hold the micro LEDs ML. The temperature of the head unit 100 may be controlled by the temperature control means 104. The temperature control means 104 may be a fluid. The fluid may be heated to control the temperature of the head unit 100. In this case, the anodic oxide sheet 101 may not be thermally deformed due to the low coefficient of thermal expansion, while the thermo-deformable materials 100*b* provided in the through-holes 100*a* may be thermally deformed and expanded.

FIG. 2B is a view illustrating a state in which the surfaces of the thermo-deformable materials 100*b* expanded by temperature control of the fluid come into contact with the micro LEDs ML. as illustrated in FIG. 2B, the surfaces of the expanded thermo-deformable materials 100*b* and the micro LEDs ML may come into contact with each other in the micro LED holding portions. The thermo-deformable materials 100*b* may be configured of a material having a high coefficient of thermal expansion and thus may be easily thermally deformed. In other words, the thermo-deformable materials 100*b* may be easily thermally deformed by the heated fluid. As illustrated in FIG. 2B, the unsupported portions of the thermo-deformable materials 100*b* are thermally deformed and expanded. The head unit 100 including the expanded thermo-deformable materials 100*b* is lowered toward the micro LEDs ML of the first substrate 110. When the thermo-deformable materials 100*b* are expanded, the surfaces of the thermo-deformable materials 100*b* may protrude further than a lower portion of the anodic oxide sheet 101 of the head unit 100. Due thereto, only the surfaces of the thermo-deformable materials 100*b* may come into contact with the upper surfaces of the micro LEDs ML.

In FIG. 2B, the surfaces of the expanded thermo-deformable materials 100 *b* and the micro LEDs ML come into contact with each other. However, the thermo-deformable materials 100*b* of the head unit 100 may be lowered in an expanded state toward the micro LEDs ML and come into contact with the micro LEDs ML. Due thereto, the micro LEDs ML may be held on the surfaces of the thermo-deformable materials 100*b*, while avoiding contact between the anodic oxide sheet 101 having a high degree of hardness of the head unit 100 and the micro LEDs ML. In other words, the present invention holds the micro LEDs ML at the holding portions by using the thermo-deformable materials 100*b* having a low hardness. This makes it possible to prevent the problem of damage to the micro LEDs ML and can ensure improved micro LED holding efficiency.

Furthermore, the thermo-deformable materials 100*b* are supported by the anodic oxide sheet 101 having a low coefficient of thermal expansion. Due thereto, a positional error with respect to the micro LEDs ML may not occur. As a result, accuracy of holding the micro LEDs ML can be improved. In detail, in the present invention, the surrounding areas of the holding portions are configured of the thermo-deformable materials 100*b* having a high coefficient of thermal expansion are provided at the holding portions, and a material having a low coefficient of thermal expansion (for example, anodic oxide film). Thus, the surrounding areas of the holding portions may not be easily thermally deformed. Due to the fact that the surrounding areas of the holding portions are configured of a material having a low coefficient of thermal expansion, positional alignment of the holding portions can be prevented from being changed. This makes it possible to prevent the problem of hold position error which may occur between the holding portions and the micro LEDs ML and to improve micro LED holding accuracy.

FIG. 2C is a view illustrating a state in which the micro LED transfer head 1000 having the micro LEDs ML held on the surfaces of the expanded thermo-deformable materials 100*b* is lifted. The micro LED transfer head 1000 may transfer the held micro LEDs ML onto the second substrate 120.

FIG. 2D is a view illustrating a state in which the head unit 100 is temperature-controlled by the temperature control means 104 and the thermo-deformable materials 100*b* contract thereby. As illustrated in FIG. 2D, the micro LED transfer head 1000 is lowered toward the second substrate 120. The lowered micro LED transfer head 1000 may cause the transfer head 1000*s* 100*b* to contract by using the temperature control means 104. In detail, the fluid which is the temperature control means 104 may be cooled. The thermo-deformable materials 100*b* contract by temperature control of the cooled fluid. The micro LEDs ML are detached from the surfaces of the contracted thermo-deformable materials 100*b*. In the present invention, the through-holes 100*a* are formed to be smaller in width than the micro LEDs ML. Therefore, even if a separate holding force generating means for detaching the micro LEDs ML is not provided on the second substrate 120, the micro LEDs ML can be easily detached from the surfaces of the thermo-deformable materials 100*b* only by contraction of the thermo-deformable materials 100*b*.

Figure 3:
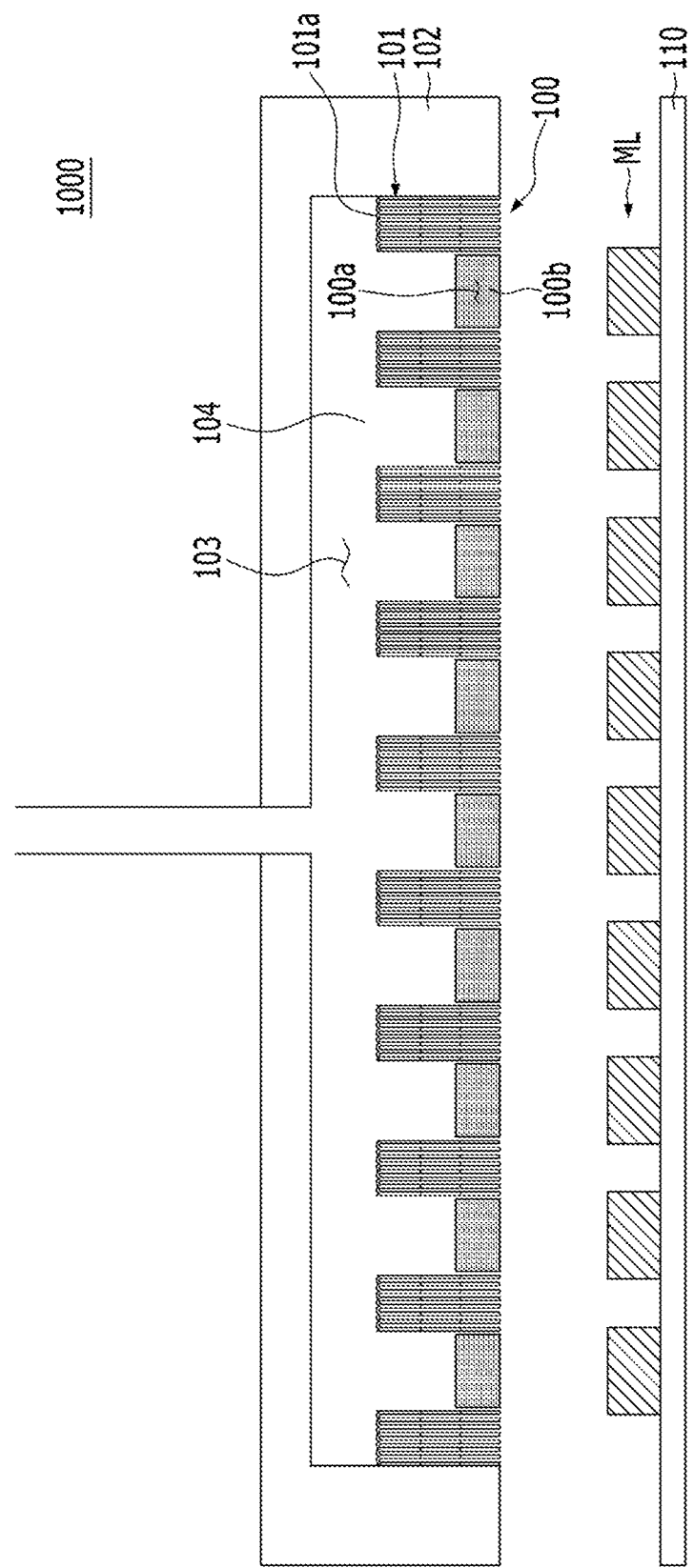
FIG. 3 is a view illustrating a modification of the first embodiment of the present invention.

FIG. 3 is a view illustrating a modification of the micro LED transfer head 1000 according to the first embodiment of the present invention. The modification differs from the first embodiment in that a plurality of anodic oxide sheets 101 forming a support part of a head unit 100 are stacked on top of each other, and other configurations are the same as those of the first embodiment.

As illustrated in FIG. 3, as one example, a micro LED transfer head 1000 according to the modification includes the support part of the head unit 100, the support part being configured by stacking three anodic oxide sheets 101. However, the number of the anodic oxide sheets 101 to be stacked is not limited thereto.

The micro LED transfer head 1000 according to the modification includes the head unit 100, a support member 102 for supporting the head unit 100, and a temperature control means 104. The head unit 100 may include a holding part for holding micro LEDs ML and provided with a thermo-deformable material 100b, and the support part for supporting the holding part.

The three anodic oxide sheets constituting the head unit 100 may be comprised of a first anodic oxide sheet, a second anodic oxide sheet, and a third anodic oxide sheet sequentially stacked on top of each other from the lower side in FIG. 3. The first to third anodic oxide sheets may be stacked on top of each other sequentially in an upward direction.

A plurality of through-holes 100a are formed in the first to third anodic oxide sheets. The through-holes 100a formed in the respective anodic oxide sheets 101 may be formed in positions corresponding to each other. Due thereto, when the first to third anodic oxide sheets are stacked, a structure in which the through-holes 100a of the respective anodic oxide sheets 101 communicate with each other may be formed.

In the micro LED transfer head 1000 according to the modification, the thermo-deformable material 100b may be provided in each of the through-holes 100a of the first anodic oxide sheet. The thermo-deformable materials 100b may be provided in all of the through-holes 100a of the first to third anodic oxide sheets or only in the through-holes 100a of the first anodic oxide sheet. However, in the present invention, the anodic oxide sheet 101 of the support part of the head unit 100 surrounds the peripheries of the thermo-deformable materials 100b and thus the thermo-deformable materials 100b can be sufficiently thermally deformed with little energy. In this case, it may be more preferable that the thermo-deformable materials 100b are not provided in all the through-holes 100a of the first to third anodic oxide sheets, but rather the through-holes 100a of the first anodic oxide sheet, which are holding portions for directly holding the micro LEDs ML. Therefore, in the modification, as one example, the thermo-deformable materials 100b may be provided only in the through-holes 100a of the first anodic oxide sheet.

The micro LED transfer head 1000 according to the modification may have a high rigidity since the plurality of anodic oxide sheets 101 are stacked to form the support part of the head unit 100. This makes it possible to prevent the center of the head unit 100 from sagging. In the case of the head unit, when the rigidity is weak, central sagging may occur, which may cause the problems of micro LED holding error and damage to the micro LEDs. However, the present invention can prevent the central sagging of the head unit 100 by stacking the plurality of anodic oxide sheets 101 to form the support part of the head unit 100. In other words, in the modification, the rigidity and flatness of the head unit 100 can be increased by stacking the plurality of anodic oxide sheets 101. As a result, there is an effect that holding efficiency to collectively hold the micro LEDs ML can be increased.

The temperature control means 104 may be a fluid. The temperature control means 104 may thermally deform the thermo-deformable materials 100b by exerting a heat effect on the thermo-deformable materials 100b through the through-holes 100a of the respective anodic oxide sheets 101 communicating with each other. By temperature control of the temperature control means 104, the thermo-deformable materials 100b may be expanded and hold the micro LEDs ML onto the surfaces thereof. Furthermore, by temperature control of the temperature control means 104, the expanded thermo-deformable materials 100b may detach the micro LEDs ML from the surfaces thereof.

In the modification, the holding portions are configured of the thermo-deformable materials 100b having a high coefficient of thermal expansion, while surrounding areas of the holding portions are configured of the anodic oxide sheets 101 having a low coefficient of thermal expansion. Therefore, no positional alignment error of the holding portions occurs. As a result, micro LED holding accuracy of the micro LED transfer head 1000 can be improved.

Hereinafter, a second embodiment of the present invention will be described with reference to FIGS. 4A to 4D. The second embodiment will be described centering on characteristic components as compared with the first embodiment. Hereinafter, descriptions of the same or similar configurations as those of the first embodiment will be omitted.

FIGS. 4A to 4D are views schematically illustrating an operation sequence of a micro LED transfer head according to the second embodiment of the present invention. The micro LED transfer head according to the second embodiment includes a head unit 100, a support member 102 for supporting the head unit 100, and a temperature control means 104 provided at an upper portion of the head unit 100.

As illustrated in FIGS. 4A to 4D, the temperature control means 104 may be provided at the upper portion of the head unit 100. FIG. 4A is a view illustrating a state in which the head unit 100 of the micro LED transfer head of the second embodiment is not temperature-controlled by the temperature control means 104.

As illustrated in FIG. 4A, a thermo-conductive film 104', which is the temperature control means 104, may be provided on an upper surface of the head unit 100. The thermo-conductive film 104' may be provided on the upper surface of the head unit 100 to transfer heat to the head unit 100. The thermo-conductive film 104' is made of a material having high thermal conductivity, for example, a metal film.

The support part of the head unit 100 may be configured of a material having a low coefficient of thermal expansion. In the present invention, as one example, the support part of the head unit 100 may be configured of an anodic oxide sheet 101 having a low coefficient of thermal expansion. The anodic oxide sheet 101 may be provided in a form in which a barrier layer 101a is removed or not removed. In FIGS. 4A to 4D, the anodic oxide sheet 101 with the barrier layer 101a removed is illustrated. When the barrier layer 101a is removed, the anodic oxide sheet 101 may have a structure in which pores vertically pass therethrough from top to bottom.

The head unit 100 includes the anodic oxide sheet 101, and a thermo-deformable material 100b provided in each of the through-holes 100a. In other words, the head unit 100 includes the support part configured of the anodic oxide sheet 101, and a holding part provided with the thermo-deformable material 100b and defined by formation of the through-holes 100a. Therefore, heat to be transferred to the head unit 100 by the thermo-conductive film 104' may affect the anodic oxide sheet 101, and the thermo-deformable materials 100b provided in the respective through-holes 100a. In this case, the anodic oxide sheet 101 may not be thermally deformed by the thermo-conductive film 104' due to the low coefficient of thermal expansion thereof. Therefore, position error of the through-holes 100a formed by passing from top to bottom through the anode oxide sheet 101 does not occur.

The thermo-deformable materials 100b may be provided in the through-holes 100a. The thermo-deformable materials 100b provided in the through-holes 100a have a high coefficient of thermal expansion. Due thereto, the thermo-deformable materials 100b may be easily thermally deformed due to heat influence by the thermo-conductive film 104'. The thermo-deformable materials 100b may be expanded in response to application of heat from the thermo-conductive film 104'. The head unit 100 is lowered toward micro LEDs ML of a first substrate 110 in a state in which the thermo-deformable materials 100b are expanded.

FIG. 4B is a view illustrating a state in which the surfaces of the thermo-deformable materials 100b expanded by temperature control of the thermo-conductive film 104' come into contact with the micro LEDs ML. as illustrated in FIG. 4B, the surfaces of the expanded thermo-deformable materials 100b and the micro LEDs ML may come into contact with each other. The thermo-deformable materials 100b are configured of a material having a high coefficient of thermal expansion. Furthermore, the thermo-deformable materials 100b have a low hardness. Therefore, when the thermo-deformable materials 100b in an expanded state and the micro LEDs ML come into contact with each other, the thermo-deformable materials 100b can hold the micro LEDs ML without causing damage to the micro LEDs ML.

FIG. 4C is a view illustrating a state in which the micro LED transfer head having the micro LEDs ML held on the surfaces of the expanded thermo-deformable materials 100b is lifted. The micro LED transfer head may transfer the held micro LEDs ML onto a second substrate 120.

FIG. 4D is a view illustrating a state in which the head unit 100 is temperature-controlled by the thermo-conductive film 104' and the thermo-deformable materials 100b contract thereby. As illustrated in FIG. 4D, the micro LED transfer head is lowered toward the second substrate 120. The thermo-conductive film 104' may be controlled to not transfer heat to the head unit 100. Due thereto, the thermo-deformable materials 100b may be contracted. As the thermo-deformable materials 100b contract, the micro LEDs ML held on the surfaces of the expanded thermo-deformable materials 100b may be detached therefrom. The micro LEDs ML detached from the surfaces of the contracted thermo-deformable materials 100b may be transferred onto the second substrate 120.

The support part of the head unit 100 of the micro LED transfer head of the second embodiment may be configured by stacking a plurality of anodic oxide sheets 101, as in the micro LED transfer head according to the modification of the first embodiment described above. In this case, the thermo-deformable materials 100b may be provided in all the through-holes 100a formed in the plurality of anodic oxide sheets 101. The thermo-conductive film 104' is provided in a form in direct contact with the upper surface of the head unit 100 to transfer heat to the head unit 100. Therefore, when the plurality of anodic oxide sheets 101 are stacked to form the support part of the head unit 100, it may be preferable that the thermo-deformable materials 100 b are provided in all the through-holes 100a of the plurality of anodic oxide sheets 101 such that heat of the thermo-conductive film is transferred to the thermo-deformable materials 100b through direct contact.

As described above, in the second embodiment, when the support part of the head unit 100 configured by stacking the plurality of anodic oxide sheets 101 is provided, the rigidity of the head unit 100 can be increased to prevent the central sagging. This makes it possible to uniformly hold the entire micro LED of the first substrate 110.

Furthermore, in the second embodiment of the present invention, surrounding areas of the holding portions are configured of a material having a low coefficient of thermal expansion, while the holding portions are configured of the thermo-deformable materials 100b having a high coefficient of thermal expansion. This makes it possible to prevent positional misalignment which may occur between the holding portions and the micro LEDs ML. As a result, micro LED holding accuracy can be improved. Furthermore, since the present invention holds the micro LEDs ML using a material having a high coefficient of thermal expansion at the holding portions, it is possible to prevent the problem of damage to the micro LEDs ML.

Hereinafter, a third embodiment of the present invention will be described with reference to FIGS. 5A to 5D. The third embodiment differs from the first and second embodiments in that a pressurizing member 105 is provided at an upper portion of a head unit 100, instead of a temperature control means 104. Furthermore, in the third embodiment, a pressure-deformable material 100b' is provided in each of a plurality of through-holes 100a, instead of the thermo-deformable material 100b. However, in this case, the pressure-deformable material 100b' may have a low hardness similarly to the thermo-deformable material 100b. The pressure-deformable material 100b may be PDMS as one example. Therefore, the above-described thermo-deformable material 100b and the pressure-deformable material 100b' may denote the same material in that they have a low hardness. Therefore, a detailed description of the pressure-deformable material 100b' will be omitted by referring to the above-described thermo-deformable material 100b.

It should be noted that the embodiment described below will be described with particular emphasis on characteristic components as compared with the first and second embodiments, and descriptions of the same or similar components as those of the first and second embodiment will be omitted.

FIGS. 5A to 5D are views schematically illustrating an operation sequence of a micro LED transfer head according to the third embodiment of the present invention. The micro LED transfer head according to the third embodiment includes the head unit 100, a support member 102 for supporting the head unit 100, and the pressurizing member 105 provided at the upper portion of the head unit 100.

The head unit 100 include a plurality of through-holes 100a passing through the head unit 100 from top to bottom. The pressure-deformable materials 100b' may be provided in the respective through-holes 100a. The pressure-deformable materials 100b' have a low hardness. Therefore, the pressure-deformable materials 100b' may be easily deformed upon application of pressure.

The support part of the head unit 100 may be configured of a material having high rigidity. The support part of the head unit 100 may be configured of a material such as a ceramic material. Alternatively, a material having high rigidity, such as an anodic oxide film, may be used. In the present invention, as one example, the support part of the head unit 100 is configured of an anodic oxide sheet 101 configured of an anodic oxide film. Since the head unit 100 includes the anodic oxide sheet 101, there is no fear of damage when the head unit 100 comes into contact with the pressurizing member 105.

The anodic oxide sheet 101 may be provided in a form in which a barrier layer 101a is removed or not removed. In FIGS. 5A to 5D, the anodic oxide sheet 101 with the barrier layer 101a removed is illustrated.

The pressurizing member 105 may be provided at the upper portion of the head unit 100. The pressurizing member 105 may be configured of a material having high rigidity. The pressurizing member 105 may include a plurality of protrusions 105a. The protrusions 105a may be provided in respective positions corresponding to the through-holes 100a of the head unit 100. Due thereto, the protrusions 105a may be inserted into the through-holes 100a when the pressurizing member 105 comes into contact with the head unit 100.

FIG. 5A is a view illustrating a state before the pressurizing member 105 and the head unit 100 come into contact with each other, and FIG. 5B is a state after the pressurizing member 105 and the head unit 100 come into contact with each other. As illustrated in FIG. 5B, as the pressurizing member 105 and the head unit 100 come into contact with each other, the protrusions 105*a* of the pressurizing member 105 may be inserted into the through-holes 100*a* of the head unit 100. In other words, the protrusions 105*a* may be inserted into a holding part. An arrow illustrated above the pressurizing member 105 of FIG. 5B may denote a pressurizing direction of the pressurizing member 105.

The pressure-deformable materials 100*b*' may be provided in the through-holes 100*a*. The pressure-deformable materials 100*b*' may be deformed such that lower portions thereof protrude by the inserted protrusions 105*a* of the pressurizing member 105. The lower portions of the pressure-deformable materials 100*b*' deformed by the pressurizing member 105 may protrude downwardly further than a lower surface of the head unit 100. The pressure-deformable materials 100*b*' deformed by the pressurizing member 105 may come into contact with micro LEDs ML as illustrated in FIG. 5B. As illustrated in FIG. 5B, only the pressure-deformable materials 100*b*' provided in holding portions come into contact with the micro LEDs ML. This makes it possible to prevent the problem of damage to the micro LEDs ML which may be caused by contact between the highly rigid anodic oxide sheet 101 and the micro LEDs ML.

FIG. 5C is a view illustrating a state in which the micro LED transfer head having the micro LEDs ML held on the surfaces of the pressure-deformable materials 100*b*' is lifted. The micro LED transfer head may transfer the held micro LEDs ML onto a second substrate 120.

FIG. 5D is a view illustrating a state in which the micro LEDs ML are detached from the surfaces of the pressure-deformable materials 100*b*' deformed by the pressurizing member 105. The micro LED transfer head with the micro LEDs ML held as illustrated in FIG. 5C may be lowered onto the second substrate 120 as illustrated in FIG. 5D. Then, as illustrated in FIG. 5D, the pressurizing member 105 may be lifted before the head unit 100. An arrow illustrated above the pressurizing member 105 of FIG. 5D may denote a lifting direction of the pressurizing member 105. When the pressurizing member 105 is lifted, the pressure-deformable materials 100*b*' which have been deformed by the pressurizing member 105 may be deformed. In detail, the lower portions of the pressure-deformable materials 100*b*' which protrude downwardly further than the lower surface of the head unit 100 as illustrated in FIG. 5B may be deformed so as not to protrude downwardly further than the lower surface of the head unit 100 as illustrated in FIG. 5D.

The head unit 100 may be configured such that the pressure-deformable materials 100*b*' are deformed to not protrude downwardly further than the lower surface of the head unit 100 by the pressurizing member 105 that is lifted before the head unit 100. Even when the pressure-deformable materials 100*b*' are deformed, adhesive force remaining in the head unit 100 may exist. In order to detach the micro LEDs ML held on the head unit 100 onto the second substrate by the adhesive force remaining in the head unit 100, a separate holding means may be provided at a lower portion of the second substrate 120. The separate holding means provided at the lower portion of the second substrate 120 may be operated after the pressure-deformable materials 100*b*' of the head unit 100 are deformed by the lifting of the pressurizing member 105. The holding means may generate a holding force capable of holding the micro LEDs ML onto the second substrate 120 at the lower portion of the second substrate 120. Due thereto, the micro LEDs ML held by the adhesive force remaining in the head unit 100 may be held by the holding force and transferred to the second substrate 120.

Meanwhile, the pressure-deformable materials 100*b*' provided in the head unit 100 may be partially provided in the through-holes 100*a* instead of being entirely provided in the through-holes 100*a*. In other words, the pressure-deformable materials 100*b*' may be provided to a height lower than the height of the through-holes 100*a* with a space free from the pressure-deformable materials 100*b*'. In this case, the pressure-deformable materials 100*b*' may be provided at a height lower than the height of the through-holes 100*a*, and may be deformed so as to protrude downwardly further than the lower surface of the head unit 100 when deformed by the pressurizing member 105 and to hold the micro LEDs ML onto the surfaces thereof. In detail, the pressure-deformable materials 100*b*' may be provided in the through-holes 100*a* with a space free from the pressure-deformable materials 100*b*' in lower portions of the through-holes 100*a*.

As described above, when the pressure-deformable materials 100*b*' are provided with a space free from the pressure-deformable materials 100*b*' in lower portions of the through-holes 100*a*, the micro LEDs ML may be detached by deforming the pressure-deformable materials 100*b* without provision of the separate holding means at the lower portion of the second substrate 120. In detail, the pressure-deformable materials 100*b*' may be provided in the through-holes 100*a* with a space free from the pressure-deformable materials 100*b*' in lower portions of the through-holes 100*a*. In this case, as illustrated in FIG. 5D, the pressurizing member 105 may be lifted before the head unit 100. Due to the lifting of the pressurizing member 105, the lower portions of the pressure-deformable materials 100*b*' that protrude downwardly further than the lower surface of the head unit 100 may be deformed so as not to protrude downwardly further than the lower surface of the head unit 100. Since the pressure-deformable materials 100*b*' are provided in the through-holes 100*a* with a space free from the pressure-deformable materials 100*b*' in lower portions of the through-holes 100*a*, the pressure-deformable materials 100*b*' may be deformed so as not to protrude downwardly further than the lower surface of the head unit 100 with a space free from the pressure-deformable materials 100*b*'.

When the head unit 100 includes the pressure-deformable materials 100*b*' provided in the through-holes 100*a* with a space free from the pressure-deformable materials 100*b*' in lower portions of the through-holes 100*a*, the adhesive force may not remain in the head unit 100 when the pressure-deformable materials 100*b*' for detaching the micro LEDs ML are deformed. Due thereto, even if the separate holding means for detaching the micro LEDs ML is not provided at the lower portion of the second substrate 120, the micro LEDs ML can be easily detached only by deformation of the pressure-deformable materials 100*b*'.

As described above, the micro LED transfer head according to the third embodiment of the present invention is configured such that the holding portions are configured of a material having a low hardness, thereby making it possible to hold the micro LEDs by easily deforming the material. Furthermore, the surrounding areas of the holding portions are configured of a material having a high degree of hardness, thereby making it possible to prevent the central sagging and improving flatness of the entire head unit 100.

As a result, it is possible to prevent the problem that hold positions of the micro LEDs ML may be misaligned due to a reduced flatness.

In the micro LED transfer head of the third embodiment, the support part of the head unit 100 may be configured by stacking a plurality of anodic oxide sheets 101. In this case, the pressure-deformable materials 100b' provided in the through-holes 100a may be provided in all the through-holes 100a of the plurality of anodic oxide sheets 101 or may be provided only in the through-holes 100a of a first anodic oxide sheet. When the micro LED transfer head includes the support part of the head unit 100 formed by stacking the plurality of anodic oxide sheets 101, the protrusions 105a of the pressurizing member 105 may be provided at a height capable of protruding the lower portions of the pressure-deformable materials 100b' downwardly further than the lower surface of the head unit 100.

Due to the provision of the support part of the head unit 100 formed by stacking the plurality of anodic oxide sheets 101, the micro LED transfer head is advantageous in maintaining flatness of the head unit 100 with high rigidity. As a result, there is an effect that the micro LEDs ML can be uniformly held to the micro LED transfer head.

Hereinafter, a fourth embodiment of the present invention will be described with reference to FIGS. 6A to 6D. The fourth embodiment differs from the first, second, and third embodiments in that a chamber 103 in which pressure is controlled is provided at an upper portion of a head unit 100. It should be noted that the embodiment described below will be described with particular emphasis on characteristic components as compared with the first, second, and third embodiments, and descriptions of the same or similar components as those of the first, second, and third embodiments will be omitted.

FIGS. 6A to 6D are views schematically illustrating an operation sequence of a micro LED transfer head according to the fourth embodiment of the present invention. The micro LED transfer head according to the fourth embodiment includes the head unit 100, a support member 102 for supporting the head unit 100, and the chamber 103 provided at the upper portion of the head unit 100.

The micro LED transfer head according to the fourth embodiment may hold micro LEDs ML by pressure control through the chamber 103 in which pressure is controlled. Therefore, the head unit 100 may include a support part configured of a material having high rigidity without fear of warpage that may be caused by pressure.

FIG. 6A is a view illustrating the micro LED transfer head of the fourth embodiment in which the pressure in the chamber 103 is not controlled.

The support part of the head unit 100 may be configured of a material having high rigidity. In the present invention, as an example, the support part of the head unit 100 may be configured by stacking a plurality of anodic oxide sheets 101. In the case of an anodic oxide sheet 101 configured of an anodic oxide film, high rigidity may be provided. Therefore, the support part of the head unit 100 may be configured of a single anodic oxide sheet 101 without stacking the plurality of anodic oxide sheets 101. In other words, the support part of the head unit 100 may be configured of at least one anodic oxide sheet 101. As an example, the micro LED transfer head of the fourth embodiment is configured such that the support part of the head unit 100 is configured by stacking three anodic oxide sheets 101. However, the number of the anodic oxide sheets 101 to be stacked is not limited thereto.

Since the support part of the head unit 100 is configured by stacking the plurality of anodic oxide sheets 101, high rigidity may be provided. This can ensure high durability against the pressure of the chamber 103. In other words, warpage may not occur in the head unit 100. The head unit 100 has rigidity that can withstand the pressure of the chamber 103 when the pressure is controlled to a high-pressure state. Therefore, product deformation due to pressure does not occur. As a result, it is possible to prevent the problem of hold position error which may occur between holding portions where pressure-deformable materials 100b' are provided and the micro LEDs ML due to product deformation, and to improve micro LED holding accuracy.

The three anodic oxide sheets constituting the head unit 100 may be comprised of a first anodic oxide sheet, a second anodic oxide sheet, and a third anodic oxide sheet sequentially stacked on top of each other from the lower side in FIGS. 6A to 6D. The first to third anodic oxide sheets may be stacked on top of each other sequentially in an upward direction.

In this case, each of the first and second anodic oxide sheets may be provided in a form in which a barrier layer 101a is removed or not removed. In FIGS. 6A to 6D, the first and second anodic oxide sheets 101 with the barrier layers 101a removed are illustrated. Meanwhile, it may be preferable that the third anodic oxide sheet is provided in a form in which a barrier layer 101a exists. In the fourth embodiment, the chamber 103 in which pressure is controlled may be provided at the upper portion of the head unit 100 to control the pressure of a through-hole 100a of the head unit 100. In other words, the pressure of holding part of the head unit 100 may be controlled. In this case, pores of the third anodic oxide sheet 101 in direct contact with the chamber 103 may be adversely affected by the pressure of the chamber 103. This is the reason why the third anodic oxide sheet 101 in direct contact with the chamber 103 may be provided in a form in which the barrier layer 101a exists.

The support part of the head unit 100 may include a plurality of through-holes 100a. Due to the formation of the through-holes 100a, the holding part may be defined at the head unit 100. The through-holes 100a may be formed in a shape passing through the head unit 100 from top to bottom. In detail, the through-holes 100a may pass through the support part of the head unit 100 from top to bottom. The support part of the head unit 100 is configured of the plurality of anodic oxide sheets 101. Therefore, the through-holes 100a are formed in the first to third anodic oxide sheets. The through-holes 100a formed in the respective anodic oxide sheets 101 may be formed in positions corresponding to each other. Due thereto, when the first to third anodic oxide sheets are stacked, a structure in which the through-holes 100a of the respective anodic oxide sheets 101 communicate with each other may be formed.

The pressure-deformable materials 100b' may be provided in the respective through-holes 100a. The pressure-deformable materials 100b' may be provided in all the through-holes 100a of the first to third anodic oxide sheets or only in the through-holes 100a of the first anodic oxide sheet. Alternatively, the pressure-deformable materials 100b' may be provided only in the through-holes 100a of the first and second anodic oxide sheets. The pressure-deformable materials 100b' may be provided in a form of a thin film such as a membrane. Due thereto, the pressure-deformable materials 100b' may easily deformed by pressure control of the chamber 103, both when being provided in all the through-holes 100a of the first to third anodic oxide sheets and when being provided in the through-holes 100a of the first and second anodic oxide sheets. In other words, the pressure-deformable materials 100b' may have a high modulus of elasticity. Therefore, in the present invention, as one example, the pressure-deformable materials 100b' may be provided only in the through-holes 100a of the first anodic oxide sheet. Due thereto, a pressure for deforming the pressure-deformable materials 100b' provided in the through-holes 100a of the first anodic oxide sheet may be increased by the through-holes 100a of the second and third anodic oxide sheets not provided with the pressure-deformable materials 100b'.

The chamber 103 in which pressure is controlled may be provided at the upper portion of the head unit 100. The chamber 103 may be configured such that the pressure thereof is controlled to expand and contact the pressure-deformable materials 100b' provided in the through-holes 100a.

FIG. 6B is a view illustrating a state in which the surfaces of the pressure-deformable materials 100b' expanded by the pressure of the chamber 103 controlled to a high-pressure state come into contact with the micro LEDs ML. An arrow illustrated on the left side of the chamber 103 in FIG. 6B may denote the high-pressure state of the chamber 103. The micro LED transfer head may expand the pressure-deformable materials 100b' of the head unit 100 by controlling the pressure of the chamber 103 to the high-pressure state. The pressure-deformable materials 100b' provided in the through-holes 100a of the first anodic oxide sheet may be expanded downwardly further than a lower surface of the head unit 100 by pressure concentrated downward through the through-holes 100a of the second and third anodic oxide sheets. The micro LED transfer head in which the pressure-deformable materials 100b' are expanded due to the high-pressure state of the chamber 103 may be lowered toward the micro LEDs ML of a first substrate 110 to hold the Micro LEDs ML onto the surfaces of the expanded pressure-deformable materials 100b'.

FIG. 6C is a view illustrating a state in which the micro LED transfer head having the micro LEDs ML held on the surfaces of the expanded pressure-deformable materials 100b' is lifted. The micro LED transfer head may transfer the held micro LEDs ML onto a second substrate 120.

FIG. 6D is a view illustrating a state in which the pressure-deformable materials 100b' contract by the pressure of the chamber 103 controlled to a low-pressure state. An arrow illustrated on the left side of the chamber 103 in FIG. 6D may denote the low-pressure state of the chamber 103. As illustrated in FIG. 6D, the micro LED transfer head is lowered toward the second substrate 120. Then, the pressure in the chamber 103 may be controlled to the low-pressure state. Due thereto, the pressure-deformable materials 100b' that have been expanded may be contracted upward inside the through-holes 100a. The micro LEDs ML held on the surfaces of the expanded pressure-deformable materials 100b' may be detached from the surfaces of the pressure-deformable materials 100b' which contract in the opposite direction to the expanded direction.

As described above, in the micro LED transfer head of the fourth embodiment, the chamber 103 in which pressure is controlled may be provided at the upper portion of the head unit 100. The micro LED transfer head is configured such that the support part of the head unit 100 is configured of the anodic oxide sheet 101 and the holding part is configured of the pressure-deformable materials 100b', whereby the holding portions for holding the micro LEDs and the surrounding areas of the holding portions may be configured of different materials. In other words, the micro LED transfer head may be configured by including the head unit 100 configured of materials having properties the opposite of each other. Due thereto, the holding portions that come into direct contact with the micro LEDs ML may be configured of a material having a low hardness, thereby preventing damage to the micro LEDs ML. Furthermore, the surrounding areas of the holding portions may be configured of a material having a high degree of hardness and thus may not be easily deformed by pressure. As a result, it is possible to prevent occurrence of positional misalignment of the holding portions, thereby improving accuracy of holding the micro LEDs.

As described above, the present invention has been described with reference to exemplary embodiments. However, those skilled in the art will appreciate that various modifications, additions and substitutions are possible, without departing from the scope and spirit of the invention as disclosed in the accompanying claims.

What is claimed is:

1. A micro LED transfer head, comprising:
a head unit including a plurality of through-holes formed by passing therethrough from top to bottom; and
a plurality of thermo-deformable materials each provided in each of the through-holes,
wherein micro LEDs are held onto surfaces of the thermo-deformable materials,
wherein the head unit and the thermo-deformable materials have different coefficients of thermal expansion.

2. The micro LED transfer head of claim 1, wherein a support part of the head unit is configured of at least one anodic oxide sheet.

3. The micro LED transfer head of claim 1, wherein the thermo-deformable materials provided in the respective through-holes are supported by a support part of the head unit, the support part surrounding the thermo-deformable materials.

4. The micro LED transfer head of claim 1, wherein a temperature control means is provided at an upper portion of the head unit.

5. The micro LED transfer head of claim 4, wherein the temperature control means is a fluid, and
when the thermo-deformable materials are expanded by temperature control of the fluid, the micro LEDs are held onto the surfaces of the expanded thermo-deformable materials, and when the thermo-deformable materials are contracted by temperature control of the fluid, the micro LEDs are detached from the surfaces of the contracted thermo-deformable materials.

6. The micro LED transfer head of claim 4, wherein the temperature control means is a thermo-conductive film, and
when the thermo-deformable materials are expanded by the thermo-conductive film, the thermo-deformable materials hold the micro LEDs, and when the thermo-deformable materials are contracted by the thermo-conductive film, the thermo-deformable materials detach the micro LEDs.

7. The micro LED transfer head of claim 1, wherein the thermo-deformable materials are polydimethylsiloxane (PDMS).

8. A micro LED transfer head, comprising:
a head unit including a plurality of through-holes passing therethrough from top to bottom;
a plurality of pressure-deformable materials each provided in each of the through-holes; and
a pressurizing member provided at an upper portion of the head unit and including a plurality of protrusions protruding from a lower surface of the pressurizing member, wherein each the plurality of protrusions is provided at a position corresponding to each of the through-holes, and wherein the pressure-deformable materials provided in the respective through-holes are deformed by the plurality of protrusions being inserted into the plurality of through-holes.

9. A micro LED transfer head, comprising:

a head unit including a plurality of through-holes passing therethrough from top to bottom;

a plurality of pressure-deformable materials each provided in each of the through-holes; and a chamber provided at an upper portion of the head unit and in which pressure is controlled, wherein when the pressure in the chamber is controlled to a high-pressure state, the pressure-deformable materials provided in the respective through-holes are more expanded than the head unit and the micro LEDs are held onto surfaces of the expanded pressure-deformable materials, and wherein when the pressure in the chamber is controlled to a low-pressure state, the pressure-deformable materials are more contracted than the head unit and the micro LEDs are detached from the surfaces of the contracted pressure-deformable materials.

10. The micro LED transfer head of claim 9, wherein the pressure-deformable materials expand to protrude from a lower surface of the head unit when the pressure in the chamber is controlled to the high-pressure state, and wherein the pressure-deformable materials move into the through-holes when the pressure in the chamber is controlled to the low-pressure state.

* * * * *